(12) United States Patent
Haga et al.

(10) Patent No.: US 8,734,204 B2
(45) Date of Patent: May 27, 2014

(54) POLISHING SOLUTION FOR METAL FILMS AND POLISHING METHOD USING THE SAME

(75) Inventors: Kouji Haga, Hitachi (JP); Masato Fukasawa, Hitachi (JP); Hiroshi Nakagawa, Hitachi (JP); Kouji Mishima, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 679 days.

(21) Appl. No.: 12/937,773

(22) PCT Filed: Apr. 13, 2009

(86) PCT No.: PCT/JP2009/057457
§ 371 (c)(1),
(2), (4) Date: Dec. 16, 2010

(87) PCT Pub. No.: WO2009/128430
PCT Pub. Date: Oct. 22, 2009

(65) Prior Publication Data
US 2011/0104992 A1    May 5, 2011

(30) Foreign Application Priority Data

Apr. 15, 2008 (JP) ................ P2008-105697
Nov. 11, 2008 (JP) ................ P2008-288644

(51) Int. Cl.
*B24B 1/00* (2006.01)

(52) U.S. Cl.
USPC ............... 451/36; 451/41; 451/287; 51/307; 257/E21.23; 257/E21.304

(58) Field of Classification Search
USPC ............ 451/36, 41, 63, 285, 287; 51/307; 257/E21.23, E21.304, E21.283, 257/E21.237
See application file for complete search history.

(56) References Cited

U.S. PATENT DOCUMENTS

| 4,944,836 | A | 7/1990 | Beyer et al. |
| 6,530,968 | B2 * | 3/2003 | Tsuchiya et al. ............ 51/307 |
| 2003/0013386 | A1 * | 1/2003 | Weinstein et al. ........... 451/41 |
| 2006/0000150 | A1 | 1/2006 | Kelley et al. |
| 2006/0000151 | A1 | 1/2006 | Kelley et al. |
| 2006/0135045 | A1 * | 6/2006 | Bian et al. ................ 451/36 |
| 2007/0179238 | A1 * | 8/2007 | Armini .................. 524/493 |

FOREIGN PATENT DOCUMENTS

| JP | 2-278822 | 11/1990 |
| JP | 2002-50595 | 2/2002 |
| JP | 2005-502188 | 1/2005 |
| JP | 2006-19746 | 1/2006 |
| JP | 2006-19747 | 1/2006 |
| TW | 200615363 | 5/2005 |
| TW | 200730614 | 8/2007 |
| WO | WO 02/094957 A2 | 11/2002 |
| WO | WO 2009/008431 | 1/2009 |

OTHER PUBLICATIONS

English translation of the International Preliminary Report on Patentability dated Dec. 9, 2010, for International (PCT) Application No. PCT/JP2009/057457.

(Continued)

*Primary Examiner* — Eileen P. Morgan
(74) *Attorney, Agent, or Firm* — Antonelli, Terry, Stout & Kraus, LLP (57) ABSTRACT

A polishing solution for metal films that comprises an oxidizing agent, a metal oxide solubilizer, a metal corrosion preventing agent, a water-soluble polymer and water, wherein the water-soluble polymer is a copolymer of acrylic acid and methacrylic acid, the copolymerization ratio of methacrylic acid in the copolymer being 1-20 mol % based on the total of acrylic acid and methacrylic acid.

11 Claims, 1 Drawing Sheet

(56) References Cited

OTHER PUBLICATIONS

Extended European Search Report dated Jun. 21, 2012, including a Supplementary European Search Report and a European Search Opinion, for EP Application No. 09731910.7-1235/2273537 (PCT/JP2009/057457).

Taiwanese Official Action dated Oct. 7, 2013, for TW Application No. 098112535.

* cited by examiner

POLISHING SOLUTION FOR METAL FILMS AND POLISHING METHOD USING THE SAME

TECHNICAL FIELD

The present invention relates to a polishing solution for metal films and a polishing method employing the same, and in particular it relates to a polishing solution for metal films and a polishing method employing the same in the wiring steps for semiconductor devices.

BACKGROUND ART

New microfabrication techniques are being developed in recent years for the increasingly higher integration and higher performance of semiconductor integrated circuits (hereinafter referred to as "LSI"). One such technique is Chemical Mechanical Polishing (CMP), the technique often used for flattening of interlayer insulating films, formation of metal plugs and formation of embedded wirings in LSI production steps, particularly in multilayer wiring forming steps (see Patent literature 1 below, for example).

Recently, it has been attempted to utilize copper-based metals as wiring materials to increase performance of LSIs. Copper-based metals, however, are poorly suitable for microfabrication by dry etching which is often used for forming conventional aluminum alloy wiring. The "damascene method" has therefore been largely employed for microfabrication of copper-based metals, in which method a thin-film of a copper-based metal is accumulated on an insulating film having pre-formed furrows (concavities) and elevated sections (convexities) to embed the copper-based metal in the furrows, and then the thin-film accumulated on the elevated sections (the thin-film on sections other than the furrows) is removed by CMP to form embedded wiring (see Patent literature 2 below, for example).

The common method of CMP for polishing of wiring section metals such as copper-based metals involves attaching a polishing cloth (polishing pad) onto a circular platen, dipping the polishing cloth surface into a polishing solution for metal films, pressing the metal film-formed surface of a substrate against the polishing cloth surface, rotating the platen with a prescribed pressure (hereunder referred to as "polishing load" or "polishing pressure") being applied to the metal film from the back side of the substrate, and removing the metal film on the elevated sections by mechanical friction between the polishing solution and the metal film on the elevated sections.

A polishing solution for metal films used for CMP usually comprises an oxidizing agent, a solid abrasive (hereunder referred to simply as "abrasive") and water, with a metal oxide solubilizer, metal corrosion preventing agent and the like if necessary. The basic mechanism of CMP employing a polishing solution for metal films comprising an oxidizing agent is believed to be that, first, the metal film surface is oxidized by the oxidizing agent to form an oxidation layer, and the metal film surface is polished by shaving the oxidation layer with the abrasive. In this polishing method, since the oxidation layer on the metal film surface embedded in the furrows of the insulating film is not significantly contacted by the polishing cloth and is not reached by the shaving effect of the abrasive, the oxidation layer of the metal film on the elevated sections is removed as CMP proceeds, thus flattening the substrate surface (see Non-patent literature 1 below, for example).

Polishing solutions used for high pressure polishing (for example, 20 kPa or greater) comprise polymers having a constant amount of hydrophobic functional groups introduced therein (Patent literatures 3 and 4, for example).

Recent years have seen a demand for patterned substrates micromachined to high wiring density, and methods for lowering the polishing load during polishing are being investigated.

CITATION LIST

Patent Literature

[Patent literature 1] U.S. Pat. No. 4,944,836
[Patent literature 2] Japanese Unexamined Patent Application Publication HEI No. 02-278822
[Patent literature 3] Japanese Patent Public Inspection No. 2005-502188
[Patent literature 4] Japanese Unexamined Patent Application Publication No. 2006-19746

Non Patent Literature

[Non-patent literature 1] Journal of Electrochemical Society, Vol. 138, No. 11 (1991), p. 3460-3464

SUMMARY OF INVENTION

Technical Problem

With conventional polishing solutions for low pressure polishing, however, the mechanical polishing action of the polishing solution is low, which lowers the polishing speed.

Even when a conventional polishing solution for high pressure polishing is used for low pressure polishing, the reduced mechanical polishing action of the polishing solution makes it difficult to obtain a sufficient polishing speed. Based on research by the present inventors, it is believed that the cause of insufficient polishing speed when using a polishing solution for high pressure polishing is due to the significant effects of pressure.

The present invention has been accomplished with the aim of solving this problem, and its object is to provide a polishing solution for metal films that allows sufficient polishing speed to be obtained even when the polishing load is reduced for polishing, as well as a polishing method employing the same.

Solution to Problem

The invention provides a polishing solution for metal films that comprises an oxidizing agent, a metal oxide solubilizer, a metal corrosion preventing agent, a water-soluble polymer and water, wherein the water-soluble polymer is a copolymer of acrylic acid and methacrylic acid, the copolymerization ratio of methacrylic acid in the copolymer being 1-20 mol % based on the total of the acrylic acid and the methacrylic acid.

With the polishing solution for metal films of the invention it is possible to obtain sufficient polishing speed even when the polishing load has been reduced for polishing.

When the water-soluble polymer content has been reduced in the prior art, this has tended to reduce the polishing speed for blanket wafers, which have copper-based metal integrally formed on the surface, and to significantly lower the flatness. With the polishing solution for metal films of the invention, however, it is possible to maintain high flatness while inhibiting reduction in the polishing speed for blanket wafers.

Also, etching of an oxidation layer on a metal film surface embedded in furrows by an oxidizing agent, according to the prior art, often results in fresh exposure of the metal film surface. In such cases, the exposed metal film surface becomes re-oxidized by the oxidizing agent, and when this is repeated the metal film embedded in the furrows becomes progressively etched, tending to eliminate the flattening effect. According to the invention, however, a metal corrosion preventing agent is added to the polishing solution for metal films, therefore a high flattening effect can be maintained.

Formation of embedded wiring by conventional CMP has tended to result in corrosion or dishing of metal films. According to the invention, however, an aminoacetic acid such as glycine or a metal oxide solubilizer such as amidosulfuric acid is added in addition to the metal corrosion preventing agent such as benzotriazole, and therefore corrosion or dishing of the metal film is inhibited and highly reliable LSI wiring can be formed.

A high polishing speed for the barrier layer has conventionally been a problem in that erosion is produced at the sections of high wiring density. According to the invention, however, it is possible to increase the polishing speed ratio between the metal film and barrier layer (metal film polishing speed/barrier layer polishing speed), and production of the erosion can be inhibited.

Moreover, in the prior art, a very thin metal film remains on the surface to be polished after polishing of the metal film has been completed, and during the subsequent barrier layer polishing step, the remaining metal film becomes polished with the polishing solution for polishing of the barrier layer. Generally, however, the polishing solution for polishing of the barrier layer has a low polishing speed for metal films, and as a result the throughput is lowered, or metal film remains at the end, thus lowering the polishing yield of the substrate. According to the invention, however, it is possible to inhibit residue of the metal film upon completion of the metal film, thus preventing reduction in throughput or lowering of the polishing yield of the substrate.

The viscosity of the polishing solution for metal films at 25° C. is preferably 0.5-3.0 mPa·s. In this case, a satisfactory polishing speed can be exhibited even with a low polishing load.

The polymer size of the copolymer, measured by light scattering method, is preferably 1-100 nm. This will allow a satisfactory polishing speed to be exhibited even with a low polishing load.

The standard deviation of the polymer size of the copolymer, measured by light scattering method, is preferably 1.0-300. This will allow a satisfactory polishing speed to be exhibited even with a low polishing load.

The terms "polymer size" and its "standard deviation" are used for convenience according to the invention, but these terms "polymer size" and its "standard deviation" are not the polymer size and standard deviation of the polymer alone, but rather refer to the apparent polymer size and its standard deviation when the acrylic acid/methacrylic acid copolymer or methacrylic acid homopolymer are dissolved in purified water to a concentration of 1.5 mass % and further dissolved by a solution adjusted to a pH of 9.0 with 25% ammonia water. The polymer size and its standard deviation, according to the invention, are the polymer size and its standard deviation as measured under the following measuring conditions.
(Measuring Conditions)
Measuring temperature: 25° C.
Measuring apparatus: trade name "Zetasizer 3000HS" by Malvern Instruments
Measuring wavelength: 633.0 nm
Cell type: Capillary Cell
Detection angle: 90.00 deg Measuring method: The acrylic acid/methacrylic acid copolymer or methacrylic acid homopolymer was dissolved in purified water to a concentration of 1.5 mass %, and the solution was adjusted to a pH of 9.0 with 25% ammonia water to obtain a solution. The solution was then filtered using a 0.5 μm filter, and the polymer size and its standard deviation were measured by light scattering method to obtain the measured values.

The abrasive content is preferably 0-0.5 mass % based on the entire polishing solution. This will allow a satisfactory polishing speed to be obtained for metal films.

The pH of the polishing solution for metal films is preferably 2.0-5.0. This can efficiently lower the pressure dependency of the polishing speed.

The weight-average molecular weight Mw of the copolymer is preferably 50,000-500,000. This will allow a satisfactory polishing speed to be exhibited even with a low polishing load.

The invention further relates to a polishing method whereby the aforementioned polishing solution for metal films is supplied onto a polishing cloth of a platen, and the platen and a substrate are moved relative to each other with the surface to be polished of the substrate pressed against the polishing cloth, for polishing of the surface to be polished.

With the polishing method of the invention it is possible to obtain sufficient polishing speed even when the polishing load has been reduced for polishing.

Advantageous Effects of Invention

According to the invention there are provided a polishing solution for metal films, and a polishing method employing it, which allow sufficient polishing speed to be obtained even when the polishing load has been reduced during polishing.

DESCRIPTION OF EMBODIMENTS

Preferred embodiments of the invention will now be explained with reference to the accompanying drawings where necessary. Throughout the explanation of the drawings, identical or corresponding elements will be referred to by like reference numerals and will be explained only once.

The polishing solution for metal films of this embodiment comprises a metal oxidizing agent, a metal oxide solubilizer, a metal corrosion preventing agent, a water-soluble polymer and water, wherein the water-soluble polymer is a copolymer of acrylic acid and methacrylic acid.

The polishing solution for metal films of this embodiment can exhibit its maximum effect when the film to be polished is a copper-based metal. For this embodiment, a "copper-based metal" is at least one kind selected from among copper, copper alloy, copper oxides and copper alloy oxides. Copper, copper alloy, copper oxide and copper alloy oxide films can be formed by known sputtering or plating methods.

Each component used for preparation of the polishing solution will now be explained.
(Water-Soluble Polymer)
As mentioned above, the polishing solution for metal films of this embodiment comprises a copolymer of acrylic acid and methacrylic acid as the water-soluble polymer. Conventional polishing solutions used for various purposes employ water-soluble polymers as dispersing agents or polishing speed regulators, but it has generally been believed that a similar effect of improvement in the polishing characteristics is exhibited regardless of the water-soluble polymer used. However, it was found that a solution to the aforementioned problem can be achieved only when acrylic acid and methacrylic acid are copolymerized in a specific copolymerization ratio.

The copolymerization ratio of methacrylic acid in the copolymer of acrylic acid and methacrylic acid is 1-20 mol %, preferably 1-18 mol %, more preferably 1-15 mol % and even more preferably 1-10 mol %, based on the total of acrylic acid and methacrylic acid. If the copolymerization ratio of methacrylic acid is 1-20 mol % it will not only be possible to obtain a satisfactory polishing speed for copper-based metals, but the viscosity of the polishing solution for metal films will also be easier to adjust. The copolymerization ratio can be determined from the molar ratio of the starting monomer. The copolymerization ratio can be measured by isolating the water-soluble polymer from the polishing solution for metal films and quantifying the protons of the carboxyl groups using $^1$H-NMR.

The viscosity of the polishing solution comprising a copolymer of acrylic acid and methacrylic acid at 25° C. is preferably 0.8-3.5 mPa·s, more preferably 0.9-3.0 mPa·s and even more preferably 1.0-2.5 mPa·s. The viscosity of the polishing solution comprising the copolymer of acrylic acid and methacrylic acid at 25° C. can be measured using a commercially available Ubbelohde viscometer.

Incidentally, a polymer employing an acrylic acid-based monomer with a hydrophobic substituent as the copolymer component tends to have high viscosity and poor manageability. Also, as explained below, the water-soluble polymer in the polishing solution for metal films of this embodiment preferably has a high weight-average molecular weight, but the weight-average molecular weight cannot be increased sufficiently high since the viscosity of the water-soluble polymer will increase and thus rendering it less soluble in water.

The weight-average molecular weight Mw of the copolymer of acrylic acid and methacrylic acid is preferably at least 50,000, more preferably at least 70,000 and even more preferably at least 100,000, from the viewpoint of obtaining satisfactory polishing speed for copper-based metals. Presumably, an increasing weight-average molecular weight of the copolymer results in lower hardness of the complex layer formed on the copper-based metal surface, thereby producing the excellent polishing speed.

There is no particular restriction for the upper limit of the weight-average molecular weight of the copolymer of acrylic acid and methacrylic acid, but from the viewpoint of solubility in the polishing solution it is usually preferred to be not greater than 5,000,000, and more preferably not greater than 1,000,000. From the viewpoint of superior manageability in the case of high viscosity, the weight-average molecular weight of the copolymer is even more preferably not greater than 500,000, especially more preferably not greater than 400,000 and extremely preferably not greater than 300,000.

The weight-average molecular weight is the value obtained as Mw, measured by the following method.
Instrument (detector): Model L-3300 Liquid Chromatography Differential Refractometer by Hitachi, Ltd.
Pump: Model L-7100 for liquid chromatography, by Hitachi, Ltd.
Data processing: Model D-2520 GPC Integrator by Hitachi, Ltd.
Column: Shodex Asahipak GF-710HQ by Showa Denko K.K., inner diameter: 7.6 mm×300 mm
Eluent: 50 mM-$Na_2HPO_4$ aqueous solution/acetonitrile=90/10 (v/v)
Flow rate: 0.6 mL/min
Sample: Solution prepared with same composition as eluent, to a resin concentration of 2%, and filtered with a 0.45 μm polytetrafluoroethylene filter.
Injection rate: 0.4 μL
Standard substance for calibration: Narrow-molecular-weight sodium polyacrylate by Polymer Laboratories The polymer size of the copolymer of acrylic acid and methacrylic acid, measured by light scattering method, is preferably 1-100 nm, more preferably 1-95 nm and even more preferably 1-90 nm, from the viewpoint of the polishing speed under low polishing load.

The standard deviation of the polymer size of the copolymer of acrylic acid and methacrylic acid, measured by light scattering method, is preferably 1.0-300, more preferably 1.0-280 and even more preferably 1.0-250, from the viewpoint of the polishing speed under low polishing load.

The content of the copolymer of acrylic acid and methacrylic acid, with respect to 100 g as the total amount of the polishing solution for metal films, is preferably at least 0.001 g, more preferably at least 0.01 g and even more preferably at least 0.1 g from the viewpoint of inhibiting dishing of the metal wiring and reducing accumulation of polished substance on the polishing cloth, and preferably not greater than 10 g, more preferably not greater than 5 g and even more preferably not greater than 2 g from the viewpoint of lowering the etching speed and facilitating both the polishing speed and its in-plane uniformity.

Synthesis of the copolymer of acrylic acid and methacrylic acid for this embodiment is preferably accomplished by polymerization using a mixed solvent of water and an organic solvent (for example, 2-propanol).

(Oxidizing Agent)

The metal oxidizing agent used for this embodiment may be hydrogen peroxide, ammonium persulfate, ferric nitrate, nitric acid, potassium periodate, hypochlorous acid, ozone water or the like, with hydrogen peroxide being especially preferred. Any of these metal oxidizing agents may be used alone or in mixtures of two or more. When the target substrate is a silicon substrate including a semiconductor element, an oxidizing agent containing no non-volatilizing components is preferred to help prevent contamination by alkali metals, alkaline earth metals, halides and the like. However, hydrogen peroxide is most suitable because of the drastic time-dependent change in the composition of ozone water. When the target substrate is a glass substrate including no semiconductor element, it may be an oxidizing agent containing non-volatilizing components.

The metal oxidizing agent content, with respect to 100 g as the total amount of the polishing solution for metal films, is preferably at least 0.01 g, more preferably at least 0.1 g and even more preferably at least 3.0 g from the viewpoint of sufficient oxidation of the metal film and increase in the polishing speed, and preferably not greater than 60 g, more preferably not greater than 55 g and even more preferably not greater than 50 g from the viewpoint of minimizing thickening of the oxidation layer on the metal film surface and increasing the polishing speed.

(Metal Oxide Solubilizer)

The metal oxide solubilizer used for this embodiment is not particularly restricted so long as it is a water-soluble compound that dissolves oxidized metal complexes, and examples thereof include organic acids such as malonic acid, citric acid, malic acid, glycolic acid, glutamic acid, glyconic acid, oxalic acid, tartaric acid, picolinic acid, nicotinic acid, mandelic acid, picolinic acid, acetic acid, formic acid, succinic acid, adipic acid, glutaric acid, benzoic acid, quinaldinic acid, butyric acid, valeric acid, lactic acid, phthalic acid, fumaric acid, maleic acid, aminoacetic acid, salicylic acid, glycerinic acid and pimelic acid, esters of these organic acids, ammonium salts of these organic acids, inorganic acids such as sulfuric acid, nitric acid, phosphoric acid, acetic acid and hydrochloric acid, and ammonium salts of these inorganic acids. Any of these may be used alone or in mixtures of two or more. Organic acids are preferred among them, with malic acid, citric acid and succinic acid being more preferred. From the viewpoint of maintaining practical polishing speed while effectively minimizing the etching speed, a mixture of two or more acids or ammonium salts is effective.

The metal oxide solubilizer content, with respect to 100 g as the total amount of the polishing solution for metal films, is preferably at least 0.001 g, more preferably at least 0.01 g and even more preferably at least 0.05 g from the viewpoint of further increasing the polishing speed, and preferably not greater than 10 g, more preferably not greater than 5 g and even more preferably not greater than 1.0 g from the viewpoint of reducing the etching speed to minimize corrosion of metal wiring.

(Metal Corrosion Preventing Agent)

The metal corrosion preventing agent used for this embodiment may be a compound that can produce a chelate complex with the copper-based metal and form a strong protecting film that prevents excessive etching of the copper-based metal. Known compounds may be used for the compound, and examples include compounds with triazole backbones, compounds with imidazole backbones, compounds with pyrimidine backbones, compounds with guanidine backbones, compounds with thiazole backbones and compounds with pyrazole backbones.

Any of these metal corrosion preventing agents may be used alone or in mixtures of two or more. It is effective to use two or more metal corrosion preventing agents from the viewpoint of maintaining balance between a practical polishing speed and etching speed with low corrosion preventing agent concentration, while also effectively minimizing polishing abrasion.

Compounds with triazole backbones include 1,2,3-triazole, 1,2,4-triazole, 3-amino-1H-1,2,4-triazole, benzotriazole, 1-hydroxybenzotriazole, 1-dihydroxypropylbenzotriazole, 2,3-dicarboxypropylbenzotriazole, 4-hydroxybenzotriazole, 4-carboxyl(-1H-)benzotriazole, 4-carboxyl(-1H-)benzotriazole methyl ester, 4-carboxyl(-1H-)benzotriazole butyl ester, 4-carboxyl(-1H-)benzotriazole octyl ester, 5-hexylbenzotriazole, [1,2,3-benzotriazolyl-1-methyl][1,2,4-triazolyl-1-methyl][2-ethylhexyl]amine, tolyltriazole, naphthotriazole, bis[(1-benzotriazolyl)methyl]phosphonic acid, 3-aminotriazole and 5-methylbenzotriazole.

Compounds with imidazole backbones include 2-methylimidazole, 2-ethylimidazole, 2-isopropylimidazole, 2-propylimidazole, 2-butylimidazole, 4-methylimidazole, 2,4-dimethylimidazole, 2-ethyl-4-methylimidazole, 2-undecylimidazole and 2-aminoimidazole.

Compounds with pyrimidine backbones include pyrimidine, 1,2,4-triazolo[1,5-a]pyrimidine, 1,3,4,6,7,8-hexahydro-2H-pyrimido[1,2-a]pyrimidine, 1,3-diphenyl-pyrimidine-2,4,6-trione, 1,4,5,6-tetrahydropyrimidine, 2,4,5,6-tetraminopyrimidine sulfate, 2,4,5-trihydroxypyrimidine, 2,4,6-triaminopyrimidine, 2,4,6-trichloropyrimidine, 2,4,6-trimethoxypyrimidine, 2,4,6-triphenylpyrimidine, 2,4-diamino-6-hydroxylpyrimidine, 2,4-diaminopyrimidine, 2-acetamidepyrimidine, 2-aminopyrimidine, 2-methyl-5,7-diphenyl-(1,2,4)triazolo[1,5-a]pyrimidine, 2-methylsulfanyl-5,7-diphenyl-(1,2,4)triazolo[1,5-a]pyrimidine, 2-methylsulfanyl-5,7-diphenyl-4,7-dihydro-(1,2,4)triazolo[1,5-a]pyrimidine and 4-aminopyrazolo[3,4-d]pyrimidine, among which 4-aminopyrazolo[3,4-d]pyrimidine, 1,2,4-triazolo[1,5-a]pyrimidine, 2-methyl-5,7-diphenyl-(1,2,4)triazolo[1,5-a]pyrimidine and 2-methylsulfanyl-5,7-diphenyl-(1,2,4)triazolo[1,5-a]pyrimidine are particularly preferred from the viewpoint of polishing speed and etching speed.

Compounds with guanidine backbones include 1,3-diphenylguanidine and 1-methyl-3-nitroguanidine.

Compounds with thiazole backbones include 2-mercaptobenzothiazole, 2-aminothiazole, 4,5-dimethylthiazole, 2-amino-2-thiazoline, 2,4-dimethylthiazole and 2-amino-4-methylthiazole.

Compounds with pyrazole backbones include 3,5-dimethylpyrazole, 3-methyl-5-pyrazolone, 3-amino-5-methylpyrazole, 3-amino-5-hydroxypyrazole and 3-amino-5-methylpyrazole.

Compounds with triazole backbones are preferred among these from the viewpoint of polishing speed and etching speed. Among compounds with triazole backbones there are preferred 1,2,3-triazole, 1,2,4-triazole, 3-amino-1H-1,2,4-triazole, 4-amino-4H-1,2,4-triazole, benzotriazole, 1-hydroxybenzotriazole and 5-methylbenzotriazole.

The metal corrosion preventing agent content, with respect to 100 g as the total amount of the polishing solution for metal films, is preferably at least 0.001 g, more preferably at least 0.01 g and even more preferably at least 0.02 g from the viewpoint of more easily minimizing etching, and preferably not greater than 5.0 g, more preferably not greater than 2.0 g and even more preferably not greater than 0.5 g from the viewpoint of obtaining a practical level for the polishing speed.

The polishing solution for metal films of this embodiment is preferably acidic. If the pH of the polishing solution for metal films is too low, problems such as metal corrosion and polishing surface roughness will occur more readily. Increasing the metal corrosion preventing agent content will tend to help minimize these problems, but the pH of the polishing solution is preferably 2.0 or higher, more preferably 2.5 or higher and even more preferably 3.0 or higher. A high pH will reduce the metal corrosion effect and thus permit a lower corrosion preventing agent content, but since it will also tend to prevent a sufficient polishing speed from being obtained, it is preferably not higher than 5.0, more preferably not higher than 4.5 and even more preferably not higher than 4.3.

The pH of the polishing solution can be measured using a pH meter (for example, a Model pH 81 by Yokogawa Electric Corp.) and standard buffer (phthalate pH buffer: pH 4.21 (25° C.), neutral phosphate pH buffer: pH 6.86 (25° C.)), placing an electrode in the polishing solution after 2-point calibration and measuring the value upon stabilization after an elapse of 2 minutes or more.

(Abrasive)

It is a feature of the polishing solution for metal films of this embodiment that it promotes polishing of copper-based metals even when it contains essentially no abrasive (an abrasive content of essentially 0% with respect to the entire polishing solution). Another feature thereof is that a satisfactory polishing speed is obtained even with a low polishing load (for example, 7 kPa or lower), compared to conventional polishing solutions with low abrasive contents.

However, the polishing solution for metal films of this embodiment may still contain an abrasive. A trace amount of abrasive may be included for slight adjustment of the polishing speed. From the viewpoint of preventing reduction in flatness, the abrasive content is preferably not greater than 0.5 mass %, more preferably not greater than 0.3 mass %, even more preferably not greater than 0.2 mass %, especially preferably not greater than 0.1 mass % and extremely preferably not greater than 0.05 mass %, with respect to the entire polishing solution for metal films. Examples of abrasives that may be used for the polishing solution for metal films of this embodiment include inorganic abrasives such as silica, alumina, zirconia, ceria, titania, germania and silicon carbide, and organic abrasives such as polystyrene, polyacryl and polyvinyl chloride.

The polishing solution for metal films of this embodiment allows sufficient polishing speed to be obtained even when the polishing load has been reduced for polishing. The polishing speed is also excellent when a wiring-formed patterned wafer is polished. The barrier layer polishing speed can also be minimized, and the ratio of the metal film polishing speed with respect to the barrier layer polishing speed in the damascene process can be increased, thus allowing dishing and erosion to be inhibited.

The polishing method of this embodiment is a polishing method wherein the aforementioned polishing solution for metal films is supplied onto the polishing cloth of a platen, and the platen and substrate are moved relative to each other with the film to be polished of the substrate pressed against the polishing cloth, for polishing of the film to be polished.

The polishing apparatus may be, for example, a common polishing apparatus comprising a holder (head) that holds the substrate and a platen fitted with a polishing cloth. The polishing apparatus may also have mounted thereon a motor with variable rotational speed, and means for supplying polishing solution onto the polishing cloth (such as a pump).

There are no particular restrictions on the polishing cloth, and a common nonwoven fabric, foamed polyurethane, porous fluorine resin or the like may be used, and it is preferably furrowed to allow accumulation of the polishing solution for metal films.

The polishing conditions are not particularly restricted, but the rotational speed of the platen is preferably not higher than 200 $min^{-1}$ to prevent fly off of the substrate. The pressing pressure (the polishing pressure) of the substrate that has the film to be polished, onto the polishing cloth, is not particularly restricted and may be appropriately selected in the range of 5–50 kPa in most cases. For polishing of interlayer insulating films with low relative permittivities and laminated films employing such interlayer insulating films, the polishing pressure is preferably not greater than 30 kPa from the viewpoint of increasing the flatness of the surface to be polished.

For relative movement of the polishing cloth and the film to be polished on the substrate, with the film to be polished pressed against the polishing cloth, it is sufficient to move either or both the substrate and the platen. Polishing may also be accomplished by rotating the platen, or rotating or vibrating the holder.

There may also be employed a polishing method involving planetary rotation of the platen, or a polishing method involving linear movement of a belt-like polishing cloth in either lengthwise direction. The holder may be anchored, rotating or vibrating. These polishing methods may be appropriately selected according to the surface to be polished or polishing apparatus, so long as the polishing cloth and the film to be polished are moved relative to each other.

The method of supplying the polishing solution for metal films to the polishing apparatus for this embodiment is not particularly restricted so long as the polishing solution for metal films can be continuously supplied with a pump or the like to the polishing cloth during polishing. The amount of polishing solution supplied is also not particularly restricted, but preferably the surface of the polishing cloth is covered by the polishing solution for metal films at all times.

Upon completion of polishing, preferably the substrate is thoroughly rinsed in running water and a spin dryer or the like is used to remove the water droplets adhering to the substrate and dry the substrate.

EXAMPLES

The present invention will now be explained by examples. However, the invention is not limited to these examples.

Synthesis of Copolymer

Synthesis Example 1

In a 1 liter separable flask equipped with a stirrer, reflux condenser, thermometer, nitrogen inlet and monomer dropping inlet there were charged 240 g of deionized water and 30 g of 2-propanol, the mixture was stirred while introducing nitrogen gas onto the liquid surface at 30 mL/min, and the temperature was raised to 85° C. with an oil bath. Next, a mixture comprising 313.6 g of acrylic acid, 3.78 g of methacrylic acid and 222.6 g of deionized water was prepared and 4 g of 4,4'-azobiscyanovaleric acid (trade name: V-501 by Wako Pure Chemical Industries, Ltd.) was dissolved in the mixture. The solution was added dropwise to the flask over a period of 2 hours. After heating at 85° C. for 2 hours, the mixture was cooled to obtain acrylic acid (AA)/methacrylic acid (MA) copolymer (a).

Synthesis Example 2

Acrylic acid/methacrylic acid copolymer (b) was obtained by the same method as Synthesis Example 1, except that a solution of 4 g of 4,4'-azobiscyanovaleric acid dissolved in a mixture of 305 g of acrylic acid, 19 g of methacrylic acid and 216 g of deionized water was added dropwise to the flask.

Synthesis Example 3

Acrylic acid/methacrylic acid copolymer (c) was obtained by the same method as Synthesis Example 1, except that a solution of 4 g of 4,4'-azobiscyanovaleric acid dissolved in a mixture of 286.4 g of acrylic acid, 38 g of methacrylic acid and 215.6 g of deionized water was added dropwise to the flask.

Synthesis Example 4

Acrylic acid/methacrylic acid copolymer (d) was obtained by the same method as Synthesis Example 1, except that a solution of 4 g of 4,4'-azobiscyanovaleric acid dissolved in a mixture of 254.6 g of acrylic acid, 76 g of methacrylic acid and 209.4 g of deionized water was added dropwise to the flask.

Synthesis Example 5

Acrylic acid/methacrylic acid copolymer (e) was obtained by the same method as Synthesis Example 1, except that a solution of 2 g of 4,4'-azobiscyanovaleric acid dissolved in a mixture of 305 g of acrylic acid, 19 g of methacrylic acid and 216 g of deionized water was added dropwise to the flask.

Synthesis Example 6

Acrylic acid/methacrylic acid copolymer (f) was obtained by the same method as Synthesis Example 1, except that a solution of 0.7 g of 4,4'-azobiscyanovaleric acid dissolved in a mixture of 305 g of acrylic acid, 19 g of methacrylic acid and 216 g of deionized water was added dropwise to the flask.

Synthesis Example 7

Acrylic acid homopolymer (g) was obtained by the same method as Synthesis Example 1, except that a solution of 1.0 g of azobisisobutyronitrile dissolved in 100 g of acrylic acid was added dropwise to the flask.

Synthesis Example 8

Acrylic acid/methacrylic acid copolymer (h) was obtained by the same method as Synthesis Example 2, except that a solution of 4 g of azobisisobutyronitrile (reagent grade, by Kanto Chemical Co., Inc.) dissolved in a mixture of 305 g of acrylic acid, 19 g of methacrylic acid and 216 g of deionized water was added dropwise to the flask.

Synthesis Example 9

In a 1 liter 4-necked flask equipped with a stirrer, reflux condenser, thermometer and monomer dropping inlet there were added 575 g of deionized water and 5 g of 0.15 mass % $FeSO_4.7H_2O$ to obtain a solution. After preparing 184.6 g of a monomer mixture comprising 10.9 g of methacrylic acid and 173.7 g of acrylic acid, 20 g of the monomer mixture was added to the solution while stirring the solution at 60° C. The solution was kept at 65° C., and then there were separately added 0.5 g of sodium persulfate dissolved in 10 g of deionized water and 4 g of sodium metabisulfite dissolved in 30 g of deionized water, at a constant rate over a period of 130 minutes.

At 10 minutes after completion of addition of the sodium persulfate and sodium metabisulfite, the remaining monomer mixture was added at 72° C. a constant rate over a period of 120 minutes. After keeping the solution at 72° C. for 10 minutes, it was cooled to 62° C. Next, 0.12 g of sodium persulfate dissolved in 5 g of deionized water was added. The solution was kept at 62° C. for 10 minutes, and then stirring was initiated. To the stirred solution there were added 20.2 g of 50% sodium hydroxide and 2.7 g of 30% hydrogen peroxide. There was further added 0.25 g of isoascorbic acid dissolved in 5 g of deionized water. After keeping the solution at 62° C. for 5 minutes, it was cooled to 25° C. to obtain acrylic acid/methacrylic acid copolymer (i).

Synthesis Example 10

In a 1 liter separable flask equipped with a stirrer, reflux condenser, thermometer, nitrogen inlet and monomer dropping inlet there were charged 240 g of deionized water and 30 g of 2-propanol, the mixture was stirred for 10 minutes while introducing nitrogen gas thereinto at 100 mL/min, and then the nitrogen gas inlet was moved to the liquid surface for introduction of nitrogen gas at 30 mL/min while raising the temperature to 85° C. with an oil bath. Next, a mixture of 305 g of acrylic acid, 19 g of methacrylic acid and 218 g of deionized water was prepared and 4 g of ammonium persulfate was dissolved in the mixture. The solution was added dropwise to the flask over a period of 2 hours.

After heating at 85° C. for 2 hours, the mixture was cooled to obtain acrylic acid/methacrylic acid copolymer (j).

Synthesis Example 11

Acrylic acid/methacrylic acid copolymer (k) was obtained by the same method as Synthesis Example 9, except that 200 g of a monomer mixture comprising 109 g of methacrylic acid and 91 g of acrylic acid was prepared.

Synthesis Example 12

In a 1 liter separable flask equipped with a stirrer, reflux condenser, thermometer, nitrogen inlet and monomer dropping inlet there were charged 150 g of deionized water and 150 g of 2-propanol, the mixture was stirred while introducing nitrogen gas onto the liquid surface at 30 mL/min, and the temperature was raised to 85° C. with an oil bath. Next, a mixture of 66.1 g of acrylic acid and 33.9 g of methacrylic acid was prepared, and 0.85 g of 2,2'-azobisisobutyronitrile was dissolved in the mixture. The solution was added dropwise to the flask over a period of 1.5 hours. After heating at 85° C. for 2 hours, the mixture was cooled to obtain acrylic acid/methacrylic acid copolymer (l).

Synthesis Example 13

Acrylic acid/methacrylic acid copolymer (m) was obtained by the same method as Synthesis Example 12, except that a solution of 0.9 g of 2,2'-azobisisobutyronitrile dissolved in a mixture of 45.6 g of acrylic acid and 54.4 g of methacrylic acid was added dropwise to the flask.

Synthesis Example 14

Acrylic acid/methacrylic acid copolymer (n) was obtained by the same method as Synthesis Example 12, except that a solution of 0.95 g of 2,2'-azobisisobutyronitrile dissolved in a mixture of 26.4 g of acrylic acid and 73.6 g of methacrylic acid was added dropwise to the flask.

Synthesis Example 15

Methacrylic acid homopolymer (o) was obtained by the same method as Synthesis Example 12, except that a solution of 1.0 g of 2,2'-azobisisobutyronitrile dissolved in 100 g of methacrylic acid was added dropwise to the flask.

Example 1-1

There were added to the total mass of the polishing solution, 0.21 mass % of citric acid, 0.11 mass % of benzotriazole, 0.84 mass % of acrylic acid/methacrylic acid copolymer (a) (copolymerization ratio: AA/MA=99/1, weight-average molecular weight Mw: 160,000), 10 mass % of hydrogen peroxide (reagent grade) and purified water to a volume of 100 mass %, and then ammonia water with a 25 mass % concentration was added for adjustment to pH 3.5 (polishing solution A).

Example 1-2

Acrylic acid/methacrylic acid copolymer (b) (copolymerization ratio: AA/MA=95/5, weight-average molecular weight Mw: 160,000) with a different copolymerization ratio was used instead of the acrylic acid/methacrylic acid copolymer (a) in Example 1-1. A polishing solution with a pH of 3.5 was obtained using the same composition, contents and procedure as Example 1-1, except for changing the copolymerization ratio (polishing solution B).

Example 1-3

Acrylic acid/methacrylic acid copolymer (c) (copolymerization ratio: AA/MA=90/10, weight-average molecular weight Mw: 160,000) with a different copolymerization ratio was used instead of the acrylic acid/methacrylic acid copolymer (a) in Example 1-1. A polishing solution with a pH of 3.5 was obtained using the same composition, contents and procedure as Example 1-1, except for changing the copolymerization ratio (polishing solution C).

Example 1-4

Acrylic acid/methacrylic acid copolymer (d) (copolymerization ratio: AA/MA=80/20, weight-average molecular weight Mw: 160,000) with a different copolymerization ratio was used instead of the acrylic acid/methacrylic acid copolymer (a) in Example 1-1. A polishing solution with a pH of 3.5 was obtained using the same composition, contents and procedure as Example 1-1, except for changing the copolymerization ratio (polishing solution D).

Example 1-5

Acrylic acid/methacrylic acid copolymer (e) (copolymerization ratio: AA/MA=95/5, weight-average molecular weight Mw: 300,000) with a different weight-average molecular weight Mw was used instead of the acrylic acid/methacrylic acid copolymer (b) in Example 1-2. A polishing solution with a pH of 3.5 was obtained using the same composition, contents and procedure as Example 1-2, except for changing the weight-average molecular weight (polishing solution E).

Example 1-6

Acrylic acid/methacrylic acid copolymer (f) (copolymerization ratio: AA/MA=95/5, weight-average molecular weight Mw: 1,000,000) with a different weight-average molecular weight Mw was used instead of the acrylic acid/methacrylic acid copolymer (b) in Example 1-2. A polishing solution with a pH of 3.5 was obtained using the same composition, contents and procedure as Example 1-2, except for changing the weight-average molecular weight (polishing solution F).

Example 1-7

A polishing solution with a pH of 3.5 was obtained by adding a colloidal silica abrasive with a mean particle size of 35 nm to polishing solution B of Example 1-2 to 0.26 mass % with respect to the entire polishing solution (polishing solution G). The colloidal silica was produced by hydrolysis of tetraethoxysilane in an ammonia solution.

Comparative Example 1-1

Acrylic acid homopolymer (g) (weight-average molecular weight Mw: 160,000) was used instead of the acrylic acid/methacrylic acid copolymer (a) in Example 1-1. A polishing solution with a pH of 3.5 was obtained using the same composition, contents and procedure as Example 1-1, except for using an acrylic acid homopolymer instead of an acrylic acid/methacrylic acid copolymer (polishing solution H).

The weight-average molecular weights (Mw) of the acrylic acid/methacrylic acid copolymers and acrylic acid homopolymers used in Examples 1-1 to 1-7 and Comparative Example 1-1, and the polishing performances of polishing solutions A-H, were measured in the following manner.

(Measuring Conditions for Weight-Average Molecular Weight)

The weight-average molecular weight was read off as the value of "Mw", measured in the following manner.
Instrument (detector): Model L-3300 Liquid Chromatography Differential Refractometer by Hitachi, Ltd.
Pump: Model L-7100 for liquid chromatography, by Hitachi, Ltd.
Data processing: Model D-2520 GPC Integrator by Hitachi, Ltd.
Column: Shodex Asahipak GF-710HQ by Showa Denko K.K., inner diameter: 7.6 mm×300 mm
Eluent: 50 mM-$Na_2HPO_4$ aqueous solution/acetonitrile=90/10 (v/v)
Flow rate: 0.6 mL/min
Sample: Solution prepared with same composition as eluent to a resin concentration of 2%, and filtered with a 0.45 μm polytetrafluoroethylene filter.
Injection rate: 0.4 μL
Standard substance for calibration: Narrow-molecular-weight sodium polyacrylate by Polymer Laboratories (Polishing Conditions)
Base substrate (I): Non-patterned 8-inch-diameter copper film-attached blanket silicon substrate.
Layer structure: Silicon substrate/interlayer insulating film (silicon dioxide, mean film thickness: 300 nm)/barrier layer (tantalum nitride, mean film thickness: 25 nm)/metal layer (copper, mean film thickness: 1.5 μm).
Base substrate (II): Non-patterned 8-inch-diameter tantalum nitride-attached blanket silicon substrate.
Layer structure: Silicon substrate/interlayer insulating film (silicon dioxide, mean film thickness: 300 nm)/barrier layer (tantalum nitride, mean film thickness: 150 nm).
Base substrate (III): Patterned 8-inch-diameter silicon substrate (854CMP pattern by ATDF).
Layer structure: Silicon substrate with 0.5 μm-deep furrow/interlayer insulating film (silicon dioxide, mean film thickness: 300 nm)/barrier layer (tantalum nitride, mean film thickness: 25 nm)/metal layer (copper, mean film thickness: 850 nm).

The base substrate (III) was obtained by forming a 300 nm-thick silicon dioxide film as an interlayer insulating film on the silicon substrate, by CVD method. Photolithography of the interlayer insulating film formed alternating steps, having furrows with widths of 100 μm and depths of 0.5 μm (corresponding to wiring metal sections), and elevated sections with widths of 100 μm (corresponding to interlayer insulating sections).

Figure 1:
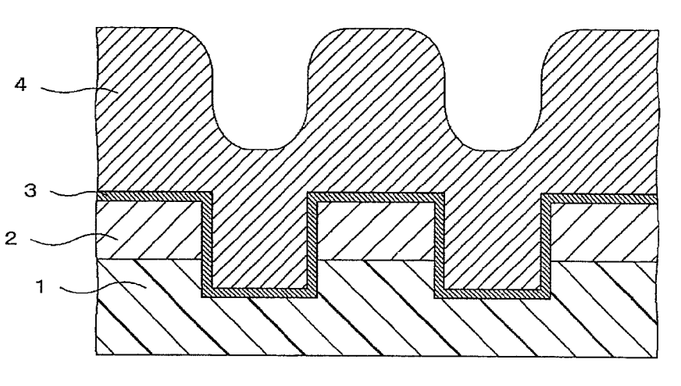
FIG. 1 is a schematic cross-sectional view of a base substrate used for evaluation of the polishing performance in the examples.

A tantalum nitride film with a mean film thickness of 25 nm was also formed as a barrier layer along the surface of the interlayer insulating film, by sputtering. A 850 nm copper film was formed by plating method on the tantalum nitride film, as a metal layer to fill all of the furrows, to obtain a base substrate (III) as shown in the cross-sectional schematic drawing of FIG. 1. In FIG. 1, 1 is the silicon substrate, 2 is the interlayer insulating film, 3 is the barrier layer and 4 is the copper film.

(Polishing Conditions)
Polishing cloth: Model IC1010 by Rodel Co.
Polishing pressure: 21.0 kPa, 14.0 kPa, 7.0 kPa
Rotational speed of platen: 93 $min^{-1}$
Wafer-mounted head rotational speed: 87 $min^{-1}$
Polishing solution supply rate: 200 ml/min (Evaluation of Polishing Solution)
(1) Copper polishing speed: The base substrate (I) was subjected to CMP polishing with the polishing solution for 1 minute at a polishing pressure of 21.0 kPa, 14 kPa or 7 kPa, and the difference in the copper film thickness before and after CMP polishing was calculated from the sheet resistance value. The copper polishing speed was calculated from the difference in copper film thickness and the polishing time.

(2) Tantalum nitride (TaN) polishing speed: The base substrate (II) was subjected to CMP polishing with the polishing solution for 1 minute at a polishing pressure of 14 kPa, and the difference in copper film thickness before and after CMP polishing was calculated from the sheet resistance value. The copper polishing speed was calculated from the difference in copper film thickness and the polishing time. The polishing speed ratio was calculated as copper polishing speed/tantalum nitride polishing speed (both at a polishing load of 14 kPa). The copper and tantalum nitride film thicknesses were measured using a VR-120/08S resistance meter (by Hitachi Kokusai Electric Inc.).

(3) Base substrate (III) polishing time: The time from the start of polishing of the base substrate (III) until the tantalum nitride barrier layer was exposed across the entire surface.

(4) Dishing volume: Polishing was performed over the entire surface of the base substrate (III) until the tantalum nitride barrier layer was exposed. The volume of film lost from the furrows with respect to the elevated sections was determined as the dishing volume using a stylus step profiler, based on the surface form of the step sections of striped pattern sections having alternatingly arranged wiring metal sections with 100 μm widths and insulating film sections 100 μm widths.

(5) Erosion volume: Polishing was performed over the entire surface of the base substrate (III) until the tantalum nitride barrier layer was exposed. The surface form of the striped pattern section having alternatingly arranged wiring metal sections with 9 μm widths and interlayer insulating film sections with 1 μm widths was measured with a stylus step profiler, and the erosion volume was determined by the polishing amount of the interlayer insulating film on the striped pattern sections, based on the interlayer insulating film sections on the outer edges of the striped pattern section.

Measurement of dishing and erosion was performed using a P16-OF profiler (product of KLA-Tencor).

The evaluation results for properties (1)-(5) are shown in Table 1.

As seen in Table 1, polishing solutions A, B, C, D and E, which employed acrylic acid/methacrylic acid copolymers, clearly had high polishing speeds for copper blanket wafers with polishing loads of 21.0 kPa, 14.0 kPa and 7.0 kPa. The polishing speed for the barrier films were all low at 1 nm/min or below, while the polishing speed ratios were all above 1000, indicating high polishing speed.

Regarding the polishing properties of polishing solutions A, B, C, D and E for patterned wafers, it was clearly exhibited that satisfactory dishing properties were indicated by all, and the erosion volumes were 10-12 nm thus indicating satisfactory flattening properties.

Polishing solution F, which employed an acrylic acid/methacrylic acid copolymer with a weight-average molecular weight Mw of 1,000,000, exhibited a high polishing speed for copper blanket wafers at polishing loads of 21.0 kPa, 14.0 kPa and 7.0 kPa, although the polishing speed was slightly lower compared to polishing solutions A, B, C, D and E.

With polishing solution H which employed an acrylic acid homopolymer, the polishing speed for copper blanket wafers was lower than the polishing solutions employing acrylic acid/methacrylic acid copolymers, with all polishing loads of 21.0 kPa, 14.0 kPa and 7.0 kPa. Also, polishing solution H had a patterned wafer polishing time of 282 seconds, which was longer than polishing solutions A, B, C, D and E.

Polishing solution G, which had a colloidal silica abrasive further added to a polishing solution employing an acrylic acid/methacrylic acid copolymer, had a high polishing speed for copper, but the polishing speed for the barrier film was also high, resulting in a reduced polishing speed ratio of 94. The erosion volume of the patterned wafer was also large compared to polishing solutions A, B, C and D, and the flattening property was poor.

Example 2-1

A polishing solution with a pH of 3.5 was obtained using the same composition, contents and procedure as Example 1-2 (polishing solution I).

TABLE 1

| | | | Example | | | | | | | Comp. Ex. |
|---|---|---|---|---|---|---|---|---|---|---|
| | | | 1-1 | 1-2 | 1-3 | 1-4 | 1-5 | 1-6 | 1-7 | 1-1 |
| Polymer | | | a | b | c | d | e | f | b | g |
| Polishing solution | | | A | B | C | D | E | F | G | H |
| AA/MA copolymerization ratio | | | 99/1 | 95/5 | 90/10 | 80/20 | 95/5 | 95/5 | 95/5 | 100/0 |
| Mw | | | 160k | 160k | 160k | 160k | 300k | 1000k | 160k | 160k |
| Abrasive (mass %) | | | 0 | 0 | 0 | 0 | 0 | 0 | 0.26 | 0 |
| Copper polishing speed (nm/min) | Polishing load | 21 kPa | 854 | 878 | 876 | 880 | 885 | 700 | 900 | 679 |
| | | 14 kPa | 628 | 638 | 644 | 645 | 640 | 550 | 750 | 423 |
| | | 7 kPa | 195 | 232 | 231 | 229 | 245 | 190 | 550 | 106 |
| TaN polishing speed (nm/min) | Polishing load | 14 kPa | 0.6 | 0.5 | 0.4 | 0.6 | 0.6 | 0.5 | 8 | 0.6 |
| Polishing speed ratio | | | 1047 | 1276 | 1610 | 1075 | 1475 | 1400 | 94 | 705 |
| Base body (III) polishing time (s) | Polishing load | 14 kPa | 195 | 155 | 155 | 150 | 153 | 180 | 130 | 282 |
| Dishing volume (nm) | | | 35 | 30 | 36 | 35 | 33 | 35 | 70 | 36 |
| Erosion volume (nm) | | | 11 | 10 | 10 | 12 | 10 | 10 | 40 | 11 |

Examples 2-2 to 2-4

Comparative Example 2-1

Polishing solutions with a pH of 3.5 were obtained using the same composition, contents and procedure as Example 2-1, except for using acrylic acid/methacrylic acid copolymers h-k instead of copolymer b, as shown in Table 2 (polishing solutions J-M).

The polymerization average molecular weight (Mw), polymer size and standard deviation of the polymer size for the acrylic acid/methacrylic acid copolymers and methacrylic acid homopolymers of Examples 2-1 to 2-4 and Comparative Example 2-1, as well as the viscosities of polishing solutions I-M, were measured under the following measuring conditions.

Cell type: Capillary Cell
Detection angle: 90.00 deg
Measuring method: The acrylic acid/methacrylic acid copolymer or methacrylic acid homopolymer was dissolved in purified water to a concentration of 1.5 mass %, and the solution was adjusted to a pH of 9.0 with 25% ammonia water to obtain a solution. The solution was then filtered using a 0.5 μm filter, and the polymer size and its standard deviation were measured by light scattering method.

Polishing solutions I-M were used for evaluation of the polishing properties according to (1)-(5) above, in the same manner as polishing solutions A-H. The measurements and evaluations for Examples 2-1 to 2-4 and Comparative Example 2-1 were conducted on the same day. The evaluation results for polishing solutions I-M are shown in Table 2.

TABLE 2

| | | | Example | | | | Comp. Ex. |
|---|---|---|---|---|---|---|---|
| | | | 2-1 | 2-2 | 2-3 | 2-4 | 2-1 |
| | Polymer | | b | h | i | j | k |
| | Polishing solution | | I | J | K | L | M |
| | AA/MA ratio | | 95/5 | 95/5 | 95/5 | 95/5 | 50/50 |
| | Viscosity (mPa·s) | | 2.003 | 1.738 | 1.306 | 1.846 | 5.427 |
| | Mw (GPC method) | | Exclusion limit peak | Exclusion limit peak | Exclusion limit peak | Exclusion limit peak | Exclusion limit peak |
| | Polymer size (nm) | | 79.3 | 8.2 | 113.5 | 2.4 | 1353.5 |
| | Standard deviation of polymer size | | 189 | 6.4 | 341 | 2 | 4064 |
| Copper polishing speed (nm/min) | Polishing load | 21 kPa | 851 | 780 | 960 | 816 | 210 |
| | | 14 kPa | 709 | 687 | 718 | 696 | 144 |
| | | 7 kPa | 349 | 332 | 132 | 301 | 94 |
| TaN polishing speed (nm/min) | Polishing load | 14 kPa | 0.5 | 0.6 | 0.5 | 0.6 | 0.5 |
| | Polishing speed ratio | | 1418 | 1145 | 1436 | 1160 | 288 |
| Base body (III) polishing time (s) | Polishing load | 14 kPa | 117 | 130 | 230 | 130 | 300 |
| | Dishing volume (nm) | | 40 | 41 | Cu residue | 42 | Cu residue |
| | Erosion volume (nm) | | 12 | 12 | Cu residue | 12 | Cu residue |

The weight-average molecular weight (Mw) was measured by the method described above. For each of the copolymers b and h-k, the exclusion limit peak was present in the chart or it was overlapped with the main peak, and therefore the value of the Mw displayed in the measuring apparatus was not read off but was indicated simply as "exclusion limit peak". For example, a value of Mw=160,000 is read from the measuring apparatus for copolymer b as shown in Table 1, but an exclusion limit peak is present in the chart, and molecules of molecular weight exceeding the measuring limit are detected as molecules of relatively low molecular weight. Thus, since it is only known that the molecular weight of copolymer b is 160,000 or greater, this is indicated simply as "exclusion limit peak" in Table 2 and Table 3.

(Viscosity Measuring Conditions)
Measuring temperature: 25° C.
Measurement: Ubbelohde viscometer was used.
(Measuring Conditions for Polymer Size and its Standard Deviation, by Light Scattering Method)
Measuring temperature: 25° C.
Measuring apparatus: trade name "Zetasizer 3000HS" by Malvern Instruments
Measuring wavelength: 633.0 nm

Example 3-1

A polishing solution with a pH of 3.5 was obtained using the same composition, contents and procedure as Example 1-2 (polishing solution N).

Comparative Examples 3-1 to 3-4

Polishing solutions with a pH of 3.5 were obtained using the same composition, contents and procedure as Example 3-1, except for using acrylic acid/methacrylic acid copolymers l-o instead of copolymer b, as shown in Table 3 (polishing solutions O—R).

The weight-average molecular weight (Mw), polymer size and standard deviation of the polymer size for the acrylic acid/methacrylic acid copolymers and methacrylic acid homopolymers of Example 3-1 and Comparative Examples 3-1 to 3-4, as well as the viscosities of polishing solutions N-R, were measured under the measuring conditions described above. Measurement of the weight-average molecular weight (Mw) was conducted using GPC method, but since an exclusion limit peak was believed to be present for copolymer b, the Mw value was not read off but was indicated as "exclusion limit peak".

Polishing solutions N-R were used for evaluation of the polishing properties according to (1)-(5) above, in the same manner as polishing solutions A-H. The measurements and evaluations for Example 3-1 and Comparative Examples 3-1 to 3-4 were conducted on the same day. The evaluation results for polishing solutions N-R are shown in Table 3.

TABLE 3

| | | | Example | Comp. Ex. | | | |
|---|---|---|---|---|---|---|---|
| | | | 3-1 | 3-1 | 3-2 | 3-3 | 3-4 |
| | Polymer | | b | l | m | n | o |
| | Polishing solution | | N | O | P | Q | R |
| | AA/MA ratio | | 95/5 | 70/30 | 50/50 | 30/70 | 0/100 |
| | Viscosity (mPa·s) | | 2.003 | 1.190 | 1.136 | 1.097 | 1 |
| | Mw (GPC method) | | Exclusion limit peak | 66k | 84k | 90k | 94k |
| | Polymer size (nm) | | 79.3 | 8.6 | 5.4 | 9.3 | 4.5 |
| | Standard deviation of polymer size | | 189 | 8 | 9 | 7 | 8 |
| Copper polishing speed (nm/min) | Polishing load | 21 kPa | 739 | 637 | 734 | 554 | — |
| | | 14 kPa | 566 | 303 | 453 | 332 | 210 |
| | | 7 kPa | 234 | 13 | 77 | 105 | 113 |
| TaN polishing speed (nm/min) | Polishing load | 14 kPa | 0.5 | 0.5 | 0.5 | 0.5 | 0.5 |
| | Polishing speed ratio | | 1132 | 606 | 906 | 664 | 420 |
| Base body (III) polishing time (s) | Polishing load | 14 kPa | 117 | 270 | 140 | 182 | — |
| | Dishing volume (nm) | | 40 | Cu residue | 42 | 67 | — |
| | Erosion volume (nm) | | 12 | Cu residue | 13 | 14 | — |

REFERENCE SIGNS LIST

1: Silicon substrate, 2: interlayer insulating film, 3: barrier layer, 4: copper film.

The invention claimed is:

1. A polishing solution for metal films, comprising:
an oxidizing agent, a metal oxide solubilizer, a metal corrosion preventing agent, a water-soluble polymer and water,
wherein the water-soluble polymer is a copolymer of acrylic acid and methacrylic acid, a copolymerization ratio of methacrylic acid in the copolymer being 1-20 mol % based on the total of the acrylic acid and the methacrylic acid,
wherein a viscosity of the polishing solution for metal films at 25° C. is 0.5-3.5 mPa·s, and
wherein a weight-average molecular weight Mw of the copolymer is at least 50,000.

2. The polishing solution for metal films according to claim 1, wherein a standard deviation of a polymer size of the copolymer is 1-300 as measured by light scattering method.

3. The polishing solution for metal films according to claim 1, wherein an abrasive content is 0-0.5 mass % based on the entire polishing solution.

4. The polishing solution for metal films according to claim 1, wherein pH is 2.0-5.0.

5. The polishing solution for metal films according to claim 1, wherein a weight-average molecular weight Mw of the copolymer is 50,000-500,000.

6. A polishing method whereby a polishing solution for metal films according to claim 1 is supplied onto a polishing cloth of a platen, and the platen and a substrate are moved relative to each other with a surface to be polished of the substrate pressed against the polishing cloth, for polishing of the surface to be polished.

7. A polishing solution for metal films, comprising:
an oxidizing agent, a metal oxide solubilizer, a metal corrosion preventing agent, a water-soluble polymer and water,
wherein the water-soluble polymer is a copolymer of acrylic acid and methacrylic acid, a copolymerization ratio of methacrylic acid in the copolymer being 1-20 mol % based on the total of the acrylic acid and the methacrylic acid,
wherein a polymer size of the copolymer is 1-100 nm as measured by light scattering method, wherein a viscosity of the polishing solution for metal films at 25° C. is 0.5-3.5 mPa·s, and
wherein a weight-average molecular weight Mw of the copolymer is at least 50,000.

8. The polishing solution for metal films according to claim 7, wherein an abrasive content is 0-0.5 mass % based on the entire polishing solution.

9. The polishing solution for metal films according to claim 7, wherein pH is 2.0-5.0.

10. The polishing solution for metal films according to claim 7, wherein a weight-average molecular weight Mw of the copolymer is 50,000-500,000.

11. A polishing method whereby a polishing solution for metal films according claim 7 is supplied onto a polishing cloth of a platen, and the platen and a substrate are moved relative to each other with a surface to be polished of the substrate pressed against the polishing cloth, for polishing of the surface to be polished.

* * * * *